Sept. 3, 1968 HANS-JOACHIM KRAHN 3,400,298

SOLID STATE INTEGRATED PERIODIC STRUCTURE FOR MICROWAVE DEVICES

Filed Dec. 1, 1965 3 Sheets-Sheet 1

INVENTOR
HANS-JOACHIM KRAHN
BY Edgar O. Rost
ATTORNEY

INVENTOR
HANS-JOACHIM KRAHN
BY Edgar O. Rost
ATTORNEY

Sept. 3, 1968 HANS-JOACHIM KRAHN 3,400,298

SOLID STATE INTEGRATED PERIODIC STRUCTURE FOR MICROWAVE DEVICES

Filed Dec. 1, 1965 5 Sheets-Sheet 3

INVENTOR
HANS-JOACHIM KRAHN

BY Edgar O. Rost

ATTORNEY

United States Patent Office 3,400,298

Patented Sept. 3, 1968

3,400,298

SOLID STATE INTEGRATED PERIODIC STRUCTURE FOR MICROWAVE DEVICES

Hans-Joachim Krahn, Burlington, Mass., assignor to Raytheon Company, Lexington, Mass., a corporation of Delaware Filed Dec. 1, 1965, Ser. No. 510,893
9 Claims. (Cl. 315—3.5)

ABSTRACT OF THE DISCLOSURE

A slow wave periodic structure for traveling wave type devices is disclosed having integrated therein active electrically variable solid state components for varying the propagating characteristics of the slow wave structure, such as phase velocity, and interaction phenomenon of electromagnetic wave energy propagating along this structure with an adjacent electron beam to attain optimum operating results.

The present invention relates to transit time devices of the traveling wave type employing slow wave periodic propagating structures and more particularly to such a structure incorporating electrically variable solid state elements to selectively alter the frequency, voltage and phase relationships of the interaction phenomenon between the electrons of an electron beam and the electromagnetic fields.

Traveling wave type microwave tubes commonly employ a slow wave periodic structure, such as an interdigital delay line, having a fixed predetermined length. An electron beam is directed in close proximity to the periodic structure or axially through it to result in interaction with the electromagnetic energy propagated on the periodic structure. Such interaction is critically dependent upon the synchronization of the velocity of the electron beam with the progression or phase velocity of the electromagnetic energy. The performance of devices employing the traveling wave phenomenon is therefore to a great extent determined by the properties of the slow wave periodic structure. The radio frequency losses, coupling impedance and phase-frequency relationship, are among the parameters considered of utmost importance.

In the microwave region such periodic slow wave structures must be carefully designed and yield at best devices operative only over a limited frequency range. As a result a multiplicity of microwave devices have evolved all with similar components with the exception of the slow wave structure which must be altered for varying electrical characteristics dependent on frequency of operation desired.

It is a primary object of the present invention to provide a new and novel slow wave periodic structure for microwave devices whose electrical parameters may be altered simply.

Another object of the present invention is a new and novel solid state integrated slow wave periodic structure for microwave devices.

Still another object of the present invention is the provision of a new and novel slow wave periodic structure for microwave devices incorporating a solid state element which is essentially a voltage dependent capacitor.

Still other objects, features and advantages will be readily apparent after consideration of the following detailed specification and the accompanying drawings in which.

Figure 1:
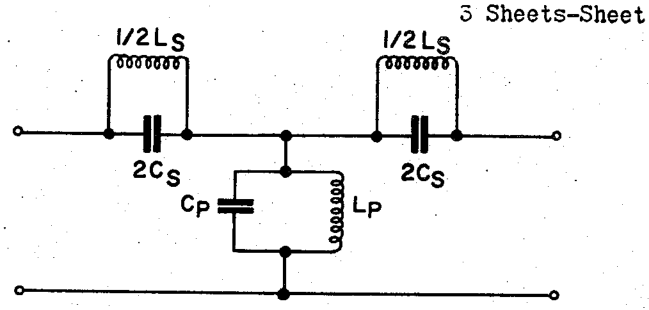
FIG. 1 is a schematic circuit diagram of an equivalent symmetrical "T" section of a general periodic slow wave structure.

To assist in an understanding of the present invention a conventional periodic slow wave structure will be analyzed in terms of an equivalent circuit network comprising lumped or distributed elements. While lumped elements, for example, inductances and capacitances, may be dealt with at relatively low frequencies, the analogy nevertheless still is applicable at microwave frequencies where the elements are distributed. Referring to FIG. 1 there is shown a symmetrical "T" section of a fourpole chain network with resonant circuits replacing the circuit constants in the conventional chain matrix network analysis. This equivalent circuit resembles a portion of a periodic slow wave circuit with filter characteristics. The circuit equivalents have been designated ½ $L_s$ and $2C_s$ for the series industances and capacitances and $L_p$ and $C_p$ for the parallel or shunt industances and capacitances. With the aid of this equivalent circuit the phase displacement $\theta$ per section from which we can determine the operating voltage and its frequency dependence may now be calculated from the relation:

$$\cos\theta = 1 - \frac{C_p}{2C_s}\,\frac{\Omega^2 - \left(\frac{\omega_p}{\omega_s}\right)^2}{1-\Omega^2} \qquad (1)$$

where $\omega_p$=the resonance frequency of the parallel circuit and is identical with the low cutoff frequency of the fourpole section and $\omega_s$=the series resonance frequency which is substantially equal to the high cutoff frequency and $$\Omega = \frac{\omega}{\omega_s}$$

Figure 2:
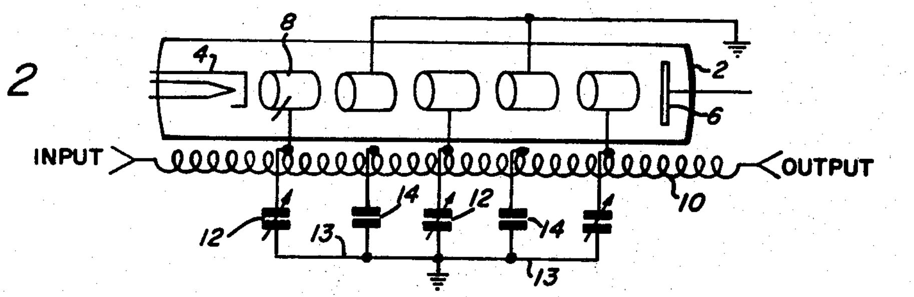
FIG. 2 is a schematic circuit diagram illustrative of the principles of the present invention in a longitudinally loaded slow wave structure.

In accordance with the teachings of the present invention one of the elements of each fourpole section or period of the slow wave circuit is provided with an element, for example the variable capacitance diode, or as it is commonly referred to, the varactor diode, to vary the electrical characteristics of the slow wave circuit. FIG. 2 illustrates schematically the components of a microwave device of the traveling wave type employing the invention in connection with lumped periodic elements and an external circuit having a helix alternately grounded and coupled to an electron beam. Envelope 2 is shown with a cathode or electron beam source 4 disposed at one end and the collector electrode 6 at the opposing end. A plurality of drift tubes 8 extend along the envelope axis in the path of the electron beam. A longitudinal external helix 10 is periodically coupled to the electron beam by means of the drift tubes 8 and variable capacitances 12 such as varactor diodes are coupled thereto in the grounded terminal lead 13 in order to apply a DC bias voltage to the diodes. A capacitor 14 is also included to assist in this biasing of the grounded helix. The external circuit configuration described is particularly applicable for low frequency operation in the region, for example, below 1,000 megacycles.

Referring to the previous equations for the calculation of the relation of phase displacement between adjacent fourpole sections as a function of frequency the assumption is made that either $C_p$ or $C_s$ is substituted or supplemented with the variable capacitance. The expression X therefore will indicate the variable. Hence, the foregoing Equation 1 becomes:

$$\cos \theta = 1 - \frac{C_p}{2C_s} \frac{X\Omega^2 - \left(\frac{\omega_p}{\omega_s}\right)^2}{1-\Omega^2} \quad (2)$$

Figure 3:
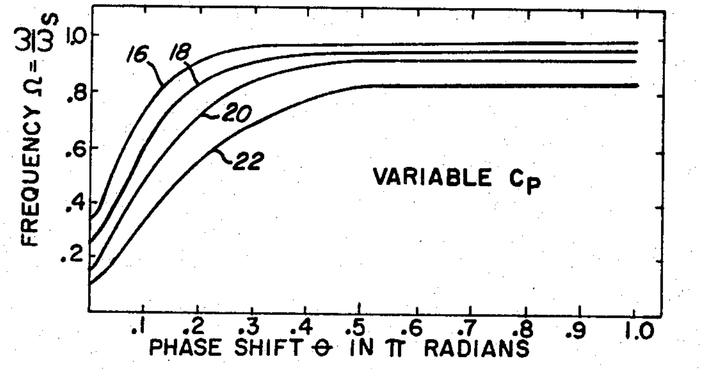
FIG. 3 is a phase vs. frequency theoretical performance chart reflecting a variable of the parallel capacitance.

In FIG. 3 this relationship of the phase shift to frequency is plotted for four variable conditions, namely curve 16 for the condition of $X=0.5$, curve 18 for the condition $X=1$, curve 20 for the condition $X=2$ and curve 22 for the condition $X=5$. In the plot of the function of the phase shift $\theta$ as a function of frequency shown in this view the following values have been assumed:

$$\frac{C_p}{C_s} = .2 \text{ and } \frac{\omega_p}{\omega_s} = 0.25$$

Figure 4:
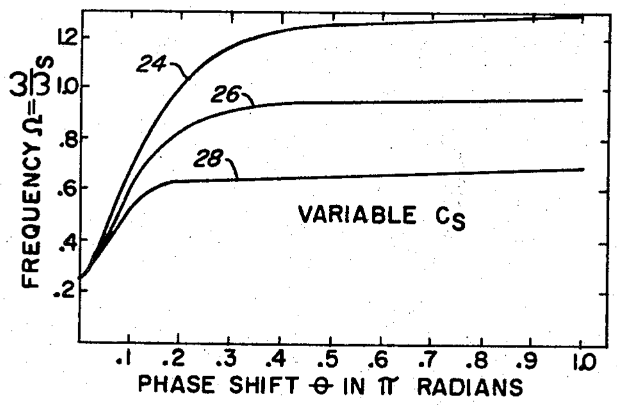
FIG. 4 is a phase vs. frequency theoretical performance chart reflecting a variable of the series capacitance.

Turning next to FIG. 4, a chart is shown with the coordinates similar to those of FIG. 3. In this illustration the variable capacitance is substituted in the earlier equation for $C_s$ and the variable is indicated by the small $y$ in the following equation:

$$\cos \theta = 1 - \frac{C_p}{2C_s} \frac{\Omega^2 - \left(\frac{\omega_p}{\omega_s}\right)^2}{1-y\Omega^2} \quad (3)$$

The variable values employed in this illustration for $y$ are 0.5 in curve 24; 1.0 in curve 26 and 2.0 in curve 28. Similar assumptions of values of $C_p/C_s$ and $\omega_p/\omega_s$ were employed in this equation as in Equation 2. Both FIGS. 3 and 4 illustrate the unique manner in which a slow wave structure can be designed to adjust the tuning slope for oscillator operation or adjust the frequency for amplifier operation. The sloping portion of each of the curves will intersect the conventional slanting line indicative of the relationship of phase velocity to velocity of light or $v_p=c$ at numerous points to thereby broaden the tuning capability of a single slow wave structure. At relatively low frequencies, VHF and UHF, wherein lumped circuit elements can be utilized in a manner to provide periodic coupling to an electron beam, the incorporation of the variable capacitances in external circuitry as shown in FIG. 2 can be simply achieved to tailor the slow wave periodic structure to any desired application. An example will be hereinafter described of a slow wave periodic structure in the microwave frequency band with variable solid state elements integrated therein and the individual periodic components of the structure mutually isolated in such a way that a bias voltage can be applied to variable elements. The invention is equally applicable to M or O type oscillators or amplifiers as well as any transit time devices wherein periodic structures are employed. Furthermore, the incorporation of the variable feature will broaden the scope of such devices for use in the modulation or programming of any number of different characteristics to achieve a modulated frequency response in the output.

A periodic slow wave structure for use in the microwave frequency bands will now be described incorporating the embodiment of the invention, reference being directed to FIGS. 5–8. The embodiment shown is an O type backward wave oscillator and discloses a severed interdigital slow wave line to thereby provide for the application of a bias voltage to the integrated solid state elements in the practice of the invention. An envelope 30 is provided at one end with a suitable base 32, such as a plug member, adapted to be inserted in an octal socket member. Base 32 includes a plurality of connecting pins 34 for connection of internal components to external circuitry. The opposing end of envelope 30 is provided with heat dissipation means 36 in the configuration of a plurality of metallic fins. Output terminal 38 of the coaxial connector type has its center conductor 40 shown in the dotted lines internally connected to a member of the interdigital slow wave structure in the conventional manner for backward wave oscillator tubes.

Electron beam producing means indicated generally by numeral 42 is mounted within the envelope 30 and may be of the Pierce gun type incorporating a heater 44, emissive cathode 46, and accelerating anode 48. Each of the individual components of the over-all electron beam producing means are connected to one or more of the pins 34 in base 32 for connection to appropriate circuitry with the battery supply for the heater element indicated by the numeral 50.

Figure 7:
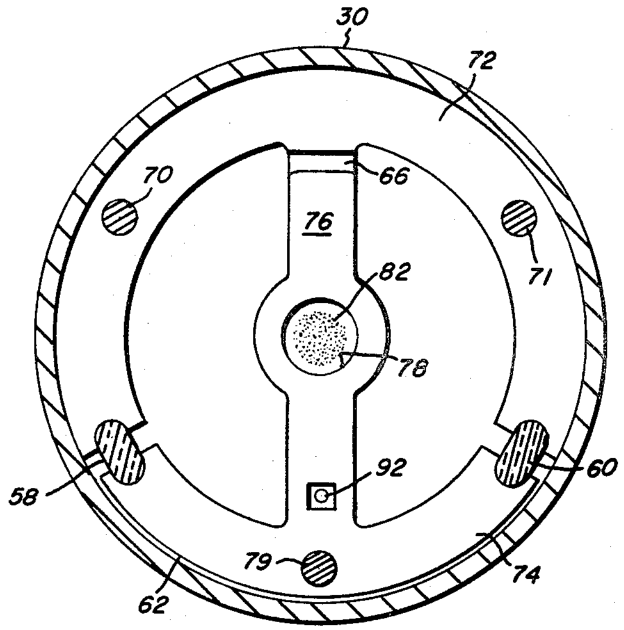
FIG. 7 is an enlarged transverse vertical section of a component of the slow wave structure shown in FIG. 6.
Figure 8:
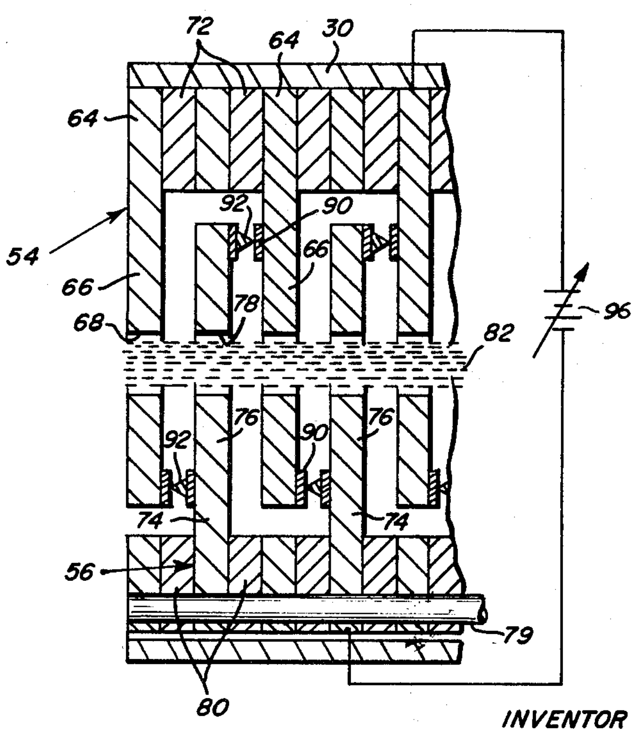
FIG. 8 is a longitudinal cross-sectional view of a portion of the stacked slow wave periodic structure assembly incorporating the structure of the present invention.

The interdigital slow wave structure indicated generally by numeral 52 comprises a plurality of stacked elements, generally circular in form, and defining a plurality of interlaced finger elements to periodically interact with an axial electron beam. FIGS. 7 and 8 illustrate the structure of delay line 52 in greater detail and while the stacked form has been selected, it is understood that the invention is equally applicable to other forms of slow wave structures such as ladder lines, ring and bar combinations or T bar configurations. The important factor to be considered is that the respective groups of opposing interdigital members be mutually isolated electrically to provide for the application of a DC bias between adjacent elements. A plurality of conductive delay line members therefore are assembled with one group of elements 54 insulated from another group of elements 56 by means of nonconductive members 58 and 60 which extend along the length of the delay line 52. The group 56 members are provided with a slightly smaller outside diameter of the arcuate portion to thereby provide a semicylindrical space 62 between the members and the envelope 30.

Element group 54 of delay line 52 comprises a plurality of plate-like conductive members 64, each defining a finger 66 having a central apertured portion 68 to provide for passage of the electron beam. The plate-like members 64 are secured together in a stacked, spaced-apart configuration by means of elongated bolts 70 and 71 together with a plurality of spacer members 72.

The interdigital delay line group members 56 comprise a plurality of conductive plate-like members 74, each of which defines a delay line finger 76 with a central apertured portion 78. The plate-like members 74 are secured in a stacked, spaced-apart configuration by means of an elongated bolt 79 together with a plurality of spacer members 80.

The resultant over-all slow wave structure 52 including interdigitated finger sections 66 and 76 extending in an alternately opposing manner defines a serpentine path for the electromagnetic energy traversing the slow wave circuit. The election beam indicated generally by the numeral 82 is axially disposed along the length of the tube and is periodically coupled to the electromagnetic circuit. A collector electrode 84 is provided at the opposing end of the envelope 30 to engage the electron beam after its traversal along the axial path. Magnetic means comprising either a solenoid or a permanent magnet (not shown) encircle the envelope 30 to provide a magnetic field indicated by the letter H and arrow 86 parallel to the tube axis to thereby confine the beam along the axial path as shown in FIG. 5.

Figure 5:
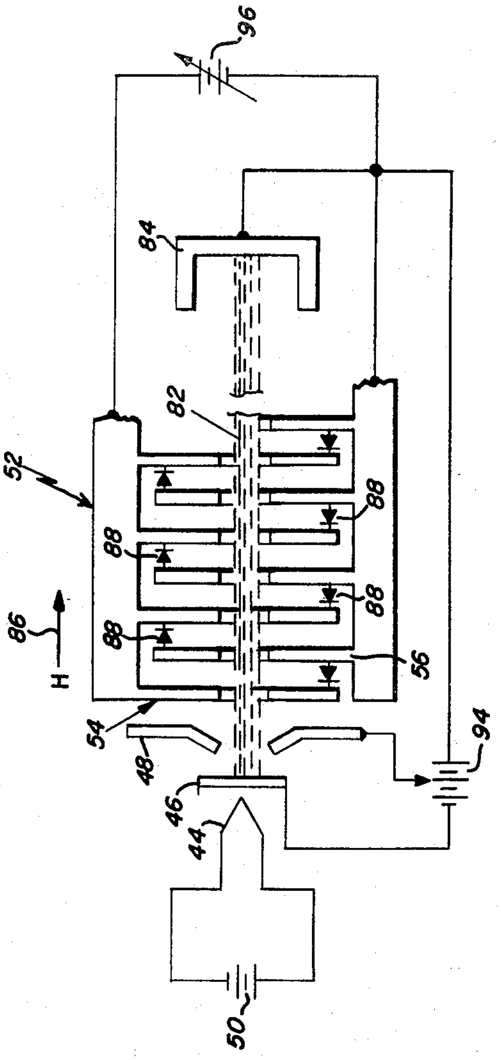
FIG. 5 is a circuit diagram illustrative of the operation of the embodiment of the invention.
Figure 6:
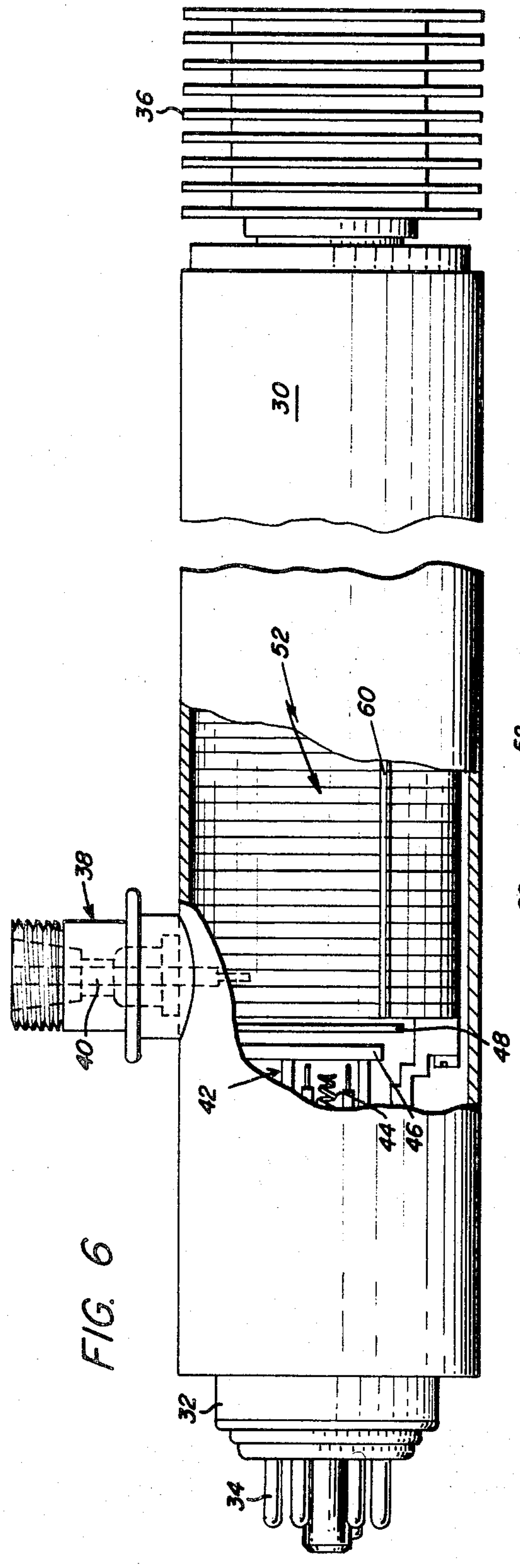
FIG. 6 is a longitudinal view partly in section of a microwave device employing a severed interdigital slow wave structure.

With the severed interdigital delay line configuration shown it is now possible to interconnect adjacent plate-like members by semiconductor solid state variable capacitance elements as indicated generally at 88 in the circuit diagram FIG. 5. The laminated configuration described in this embodiment of the invention lends itself to the integration of the semiconductor elements employing some of the modern day art such as the thin film technique. In the practice of the invention bodies 90 of a semiconductor material, preferably silicon, are disposed on opposing surfaces of finger sections 66 of plate members 64. The contact elements 92 are similarly oppositely disposed on opposing sides of finger sections 76 of plate members 74 to engage the semiconductor bodies.

In the exemplary circuit shown for applying appropriate voltages to the active elements of the structure disclosed a DC source 94 is connected between cathode 46 and the collector electrode 84. The accelerating anode 48 may also be biased by this DC source 94 by means of a suitable tap on the positive terminal. The electrically isolated groups of delay line members are suitably biased by a second DC source 96 with the positive terminal being connected to group 54 and the negative terminal being connected to group 56. A suitable DC biasing potential is thereby established across the semiconductor elements 88. DC voltage source 96 is variable to provide for suitable adjustment of the characteristics of the varactor diodes to achieve the electrical characteristic desired of the slow wave periodic structure 52.

In the foregoing illustrative embodiment an integrated semiconductor element has been shown. In applications at lower operating frequencies it is within the teachings of the invention to employ an external circuit incorporating the variable capacitance elements and couple such external circuitry periodically to the electron beam.

It is understood that while specific embodiments of the invention have been illustrated and described herein, such description is not intended to limit the spirit and scope of the broadest aspects of the present invention as set forth in the appended claims.

What is claimed is:

1. A traveling wave electron interaction device comprising:
- means for producing at least one electron beam;
- means including a slow wave electromagnetic circuit having capacitive and inductive components to periodically interact with said beam;
- and electrically variable semiconductor means coupled to said circuit to selectively vary the capacitive component thereof.

2. A traveling wave electron interaction device according to claim 1 wherein said semiconductor means include a varactor diode.

3. A traveling wave electron interaction device comprising:
- means for producing an electron beam;
- means including a slow wave delay line structure defining an energy exchanging interaction path;
- means for producing an electric field along said path to periodically interact with said beam;
- semiconductor means including a plurality of variable capacitance diodes coupled to said slow wave structure;
- and means for electrically varying and modifying said semiconductor means to alter the electrical propagating characteristics of said slow wave structure.

4. A traveling wave electron interaction device comprising an envelope;

- means for producing at least one electron beam;
- means including an interdigital slow wave delay line structure comprising a plurality of interlocking members to define a sinuous energy exchanging interaction path along the longitudinal axis of said envelope;
- means for providing an electric field along said path to periodically interact with said beam;
- voltage biased unidirectional semiconductor means including variable capacitance diodes intermittently coupled to said delay line structure;
- and means for electrically varying the voltage biasing on said semiconductor means to alter the electrical propagating characteristics of said delay line structure.

5. A traveling wave electron interaction device according to claim 4 wherein said interdigitial delay line structure comprises a first plurality of members electrically coupled together and a second plurality of members electrically coupled together, said first and second pluralities being in an interlocking array with adjacent members being electrically isolated from one another.

6. A traveling wave electron interaction device according to claim 5 wherein said semiconductor means are disposed between adjacent delay line members.

7. A traveling wave electron interaction device comprising:
- means for producing an electron beam;
- a slow wave periodic delay line structure for propagation of electromagnetic energy;
- said slow wave structure including a first and second plurality of spaced conductive members arranged in in an interlocking array to define a sinuous energy exchanging interaction path, each of said conducting members being electrically isolated from an adjacent member;
- and semiconductor material means disposed on each of said first plurality of conductive members and conductive contact elements disposed on the adjacent conductive members engaging said semiconductor material, said semiconductor means and contact elements defining a unidirectional variable capacitance diode arrangement bridging all of said delay line conductive members.

8. A traveling wave electron interaction device according to claim 7 and means for establishing a direct current voltage biasing potential across said semiconductor means.

9. A traveling wave electron interaction device according to claim 8 and means for varying the voltage biasing potential on said semiconductor means to alter the electrical characteristics of said delay line structure.

References Cited

UNITED STATES PATENTS

| | | | |
|---|---|---|---|
| 3,094,664 | 6/1963 | Kibler | 331—96 X |
| 3,171,086 | 2/1965 | Gerlach | 330—43 |
| 3,320,550 | 5/1967 | Gerlach | 331—96 |
| 3,289,030 | 11/1966 | Hergenrother | 315—3.5 |

HERMAN KARL SAALBACH, *Primary Examiner.*

S. CHATMON, Jr., *Assistant Examiner.*